United States Patent [19]
Peng et al.

[11] Patent Number: 6,060,349
[45] Date of Patent: May 9, 2000

[54] PLANARIZATION ON AN EMBEDDED DYNAMIC RANDOM ACCESS MEMORY

[75] Inventors: Tzu-Min Peng, Chupei; Keh-Ching Huang, Hsinchu; Tung-Po Chen, Taichung; Tz-Guei Jung, Hsinchu, all of Taiwan

[73] Assignee: United Microelectronics Corp., Hsinchu, Taiwan

[21] Appl. No.: 09/152,449

[22] Filed: Sep. 14, 1998

[30] Foreign Application Priority Data

Jun. 4, 1998 [TW] Taiwan ................... 87108823

[51] Int. Cl.⁷ ............................... H01L 21/8242
[52] U.S. Cl. ................ 438/239; 438/637; 438/627; 438/626
[58] Field of Search ................... 438/631, 626, 438/627, 629, 637, 239, FOR 212, FOR 335, FOR 355

[56] References Cited

U.S. PATENT DOCUMENTS

| | | |
|---|---|---|
| 4,582,563 | 4/1986 | Hazuki et al. . |
| 5,328,553 | 7/1994 | Poon . |
| 5,591,673 | 1/1997 | Chao et al. . |
| 5,702,982 | 12/1997 | Lee et al. . |
| 5,712,201 | 1/1998 | Lee et al. . |
| 5,731,234 | 3/1998 | Chen . |
| 5,858,882 | 1/1999 | Chang et al. . |

FOREIGN PATENT DOCUMENTS

| | | | |
|---|---|---|---|
| 0599592A1 | 1/1994 | European Pat. Off. | ........... 21/90 |
| 4-96336 | 3/1992 | Japan | ........... 29/78 |
| 6-37190 | 2/1994 | Japan | ........... 21/88 |

*Primary Examiner*—George Fourson
*Assistant Examiner*—Elizabeth Abbott
*Attorney, Agent, or Firm*—Thomas, Kayden, Horstemeyer & Risley

[57] ABSTRACT

A planarization method used in fabricating an embedded dynamic random access memory (DRAM). After a number of metal-oxide semiconductor (MOS) transistors and a number of capacitors are formed on a semiconductor substrate, a first inter-layer di-electric (ILD) layer is formed over the substrate. The embedded DRAM is divided into a memory region and a logic region. Next, planarization is performed. A dummy metal layer is formed and coupled to an interchangeable source/drain region of the MOS transistor in the logic region. Then a second ILD layer is formed over the logic region to compensate difference in height between the logic region and the memory region. Then, a via hole/plug is formed in the logic region to extend the first metal layer. A second metal layer with required contact window/plugs is formed over the substrate.

10 Claims, 4 Drawing Sheets

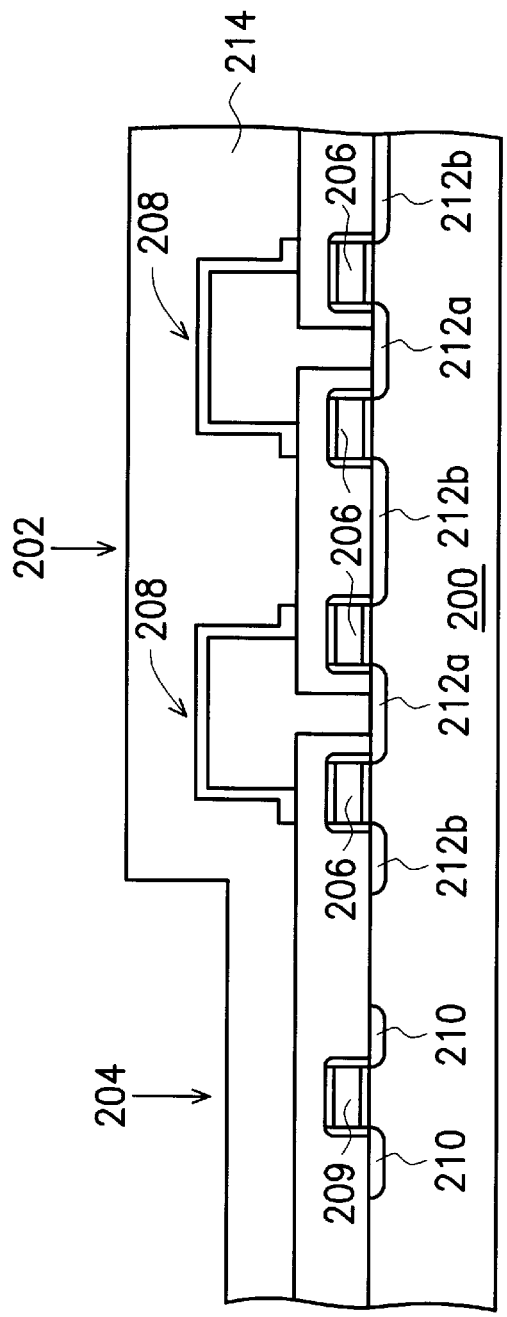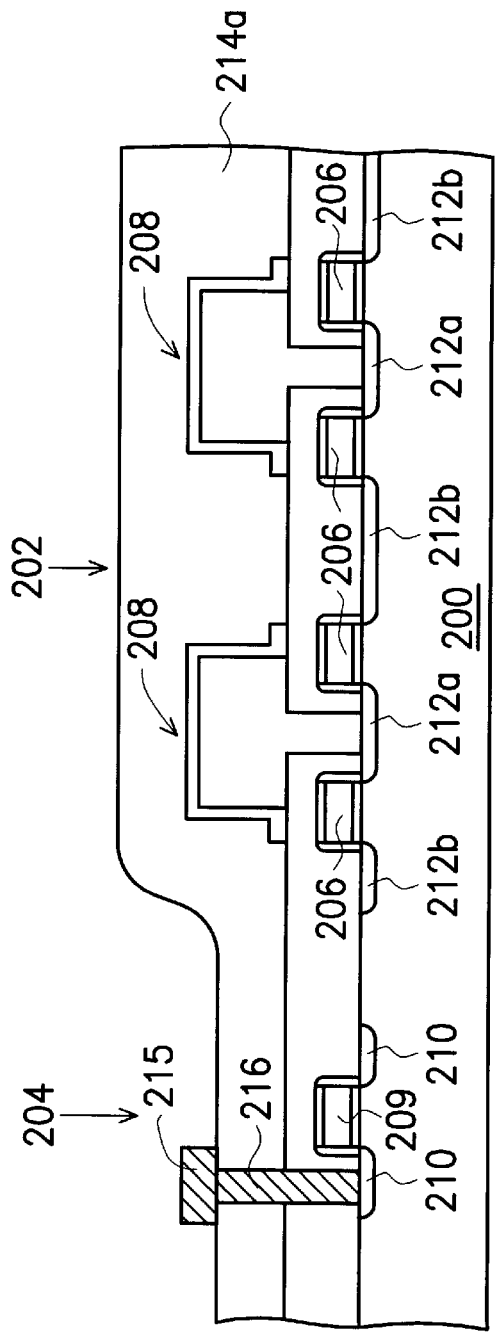

PLANARIZATION ON AN EMBEDDED DYNAMIC RANDOM ACCESS MEMORY

CROSS-REFERENCE TO RELATED APPLICATION

This application claims the priority benefit of Taiwan application Ser. No. 87108823, filed Jun. 4, 1998, the full disclosure of which is incorporated herein by reference.

BACKGROUND OF THE INVENTION

1. Field of the Invention

This invention relates to a planarization method before metallization, and more particularly to a planarization method on an embedded dynamic random access memory (DRAM) before metallization.

2. Description of Related Art

FIGS. 1A–1C are cross-sectional views schematically illustrating a metallization flow of a conventional embedded DRAM. In FIG. 1, an embedded DRAM usually includes a memory region 102 and a logic region 104 on a semiconductor substrate 100. The memory region 102 includes a metal-oxide semiconductor (MOS) transistor 106 and a capacitor 108. The capacitor 108 is electrically coupled to the MOS transistor 106 at one of its two interchangeable source/drain regions 110. The logic region 104 includes a MOS transistor 112 with its two interchangeable regions 114.

Before a metallization process on the substrate 100 is carried out, an inter-layer dielectric (ILD) layer 116 must be deposited over the substrate 100 to isolate the capacitor 108. Because of the capacitor 108 structure, the difference in height on the ILD layer 116, between the memory region 102 and the logic region 104, can be as large as 9000 Å. This large difference in height can cause difficulties in forming a contact window/plug in subsequent fabrication processes and results in a more complicated fabrication process.

In order to reduce the large difference in height, a chemical mechanical polishing (CMP) process is performed on the ILD layer 116 to planarize it as shown in FIG. 1B. After CMP, the ILD layer 116 becomes an ILD layer 116a with a difference in height of 4000–5000 Å between the memory region 102 and the logic region 104. Even so, the difference in height is still excessive and the CMP could induce the problem known as dishing phenomenon. Referring to FIG. 1C, after CMP is completed a contact window/plug 118a is formed in the memory region 102. Then a metal layer 120a is formed, and coupled to one of two interchangeable source/drain regions 110 through the contact window/plug 118a. Similarly, in the logic region, a metal layer 120b is coupled to one of two interchangeable source/drain regions 114 through a contact window/plug 118b.

As described above, the conventional planarization on the embedded DRAM has the large difference in height between the memory region 102 and the logic region 104. The large difference in height causes difficulties in the subsequent fabrication process.

SUMMARY OF THE INVENTION

It is therefore an objective of the present invention to provide a planarization method before metallization by forming a second ILD layer on the logic region to compensate for the difference in height between the memory region and the logic region. A metal layer, which is treated as a dummy-circuit, formed only to make an electrical connection, is formed after a first planarization and is coupled to one interchangeable source/drain region in the logic region through a contact window/plug. Another metal layer is formed over the second ILD layer to electrically extend the metal layer out through a via hole/plug on the second ILD layer.

In accordance with the foregoing and other objectives of the present invention, the planarization method on an embedded DRAM is provided to reduce the large difference in height. The planarization method includes a semiconductor substrate wherein a memory region and a logic region are provided. The memory region includes several MOS transistors coupled to their capacitors. The logic region only includes several MOS transistor without capacitors. Then, an ILD layer is formed over the substrate. The height of the ILD layer in the memory region and the logic region is different because of the capacitor structure. After a first planarization on the ILD layer, a first metal layer, treated as a dummy-circuit, and a contact window/plug are formed so that the first metal layer is electrically coupled to one interchangeable source/drain region in the logic region. Then, a second ILD layer is formed over the logic region. After another planarization, the memory region and the logic region have the same altitude. Then a second metal layer and a via hole/plug are formed right above the first metal layer so that the second metal layer is electrically coupled to the interchangeable source/drain region. The first metal layer is only used to make electrical connection and is not involved in the real circuit design.

BRIEF DESCRIPTION OF DRAWINGS

The invention can be more fully understood by reading the following detailed description of the preferred embodiment, with reference made to the accompanying drawings as follows:

FIGS. 2A–2D are cross-sectional views schematically illustrating a metallization and planarization flow of an embedded DRAM, according to a preferred embodiment of the invention.

DETAILED DESCRIPTION OF PREFERRED EMBODIMENT

Figure 1A:
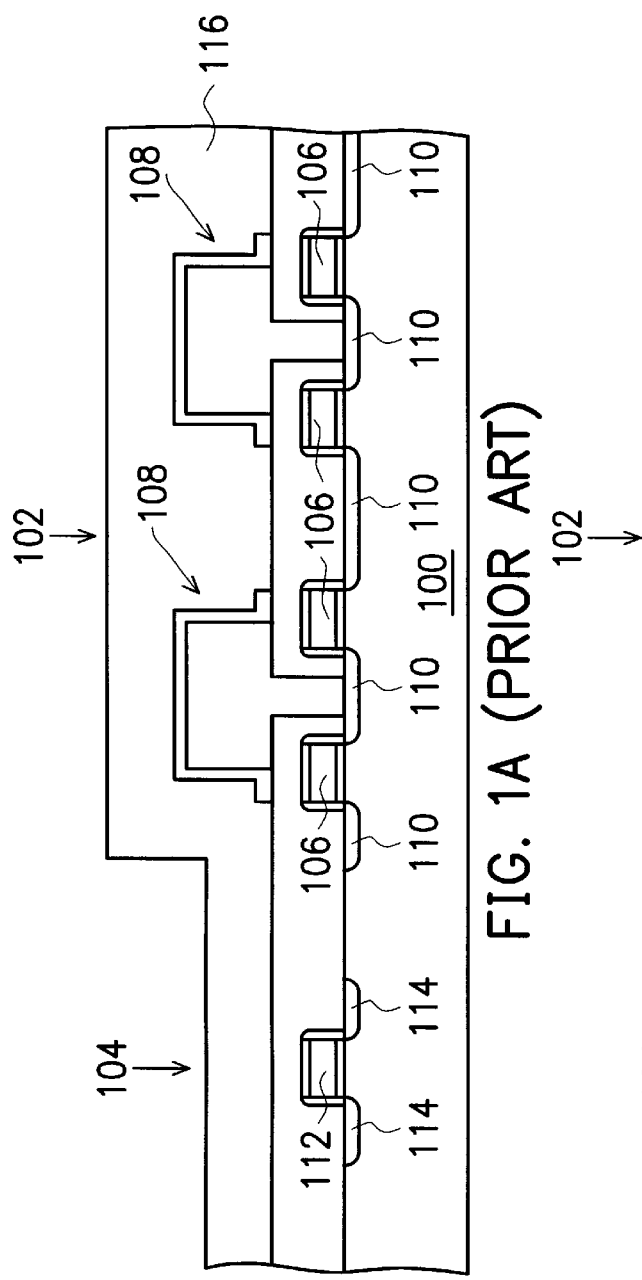
FIGS. 1A–1C are cross-sectional views schematically illustrating a metallization flow of a conventional embedded DRAM.
Figure 1B:
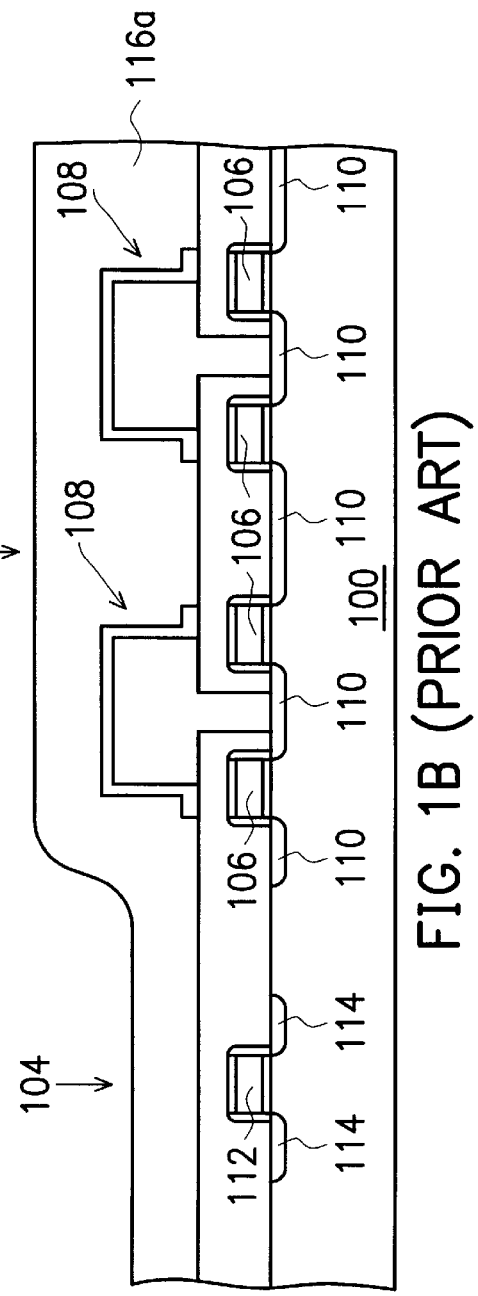
Figure 1C:
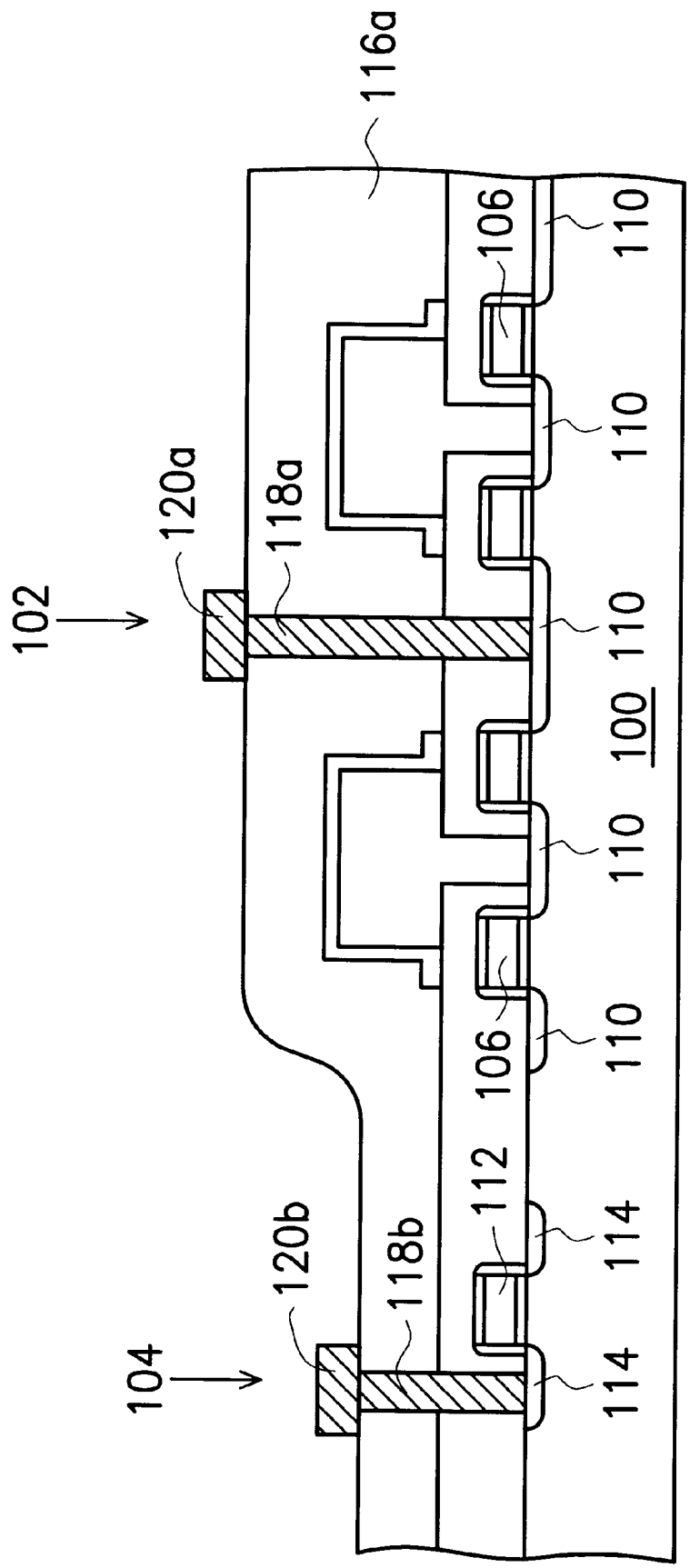

FIGS. 2A–2D are cross-sectional views schematically illustrating a metallization and planarization flow of an embedded DRAM, according to a preferred embodiment of the invention.

In FIG. 2A, an embedded DRAM includes a memory region 202 and a logic region 204 on a semiconductor substrate 200. The memory region 202 includes a metal-oxide semiconductor (MOS) transistor 206 and a capacitor 208. The capacitor 208 is electrically coupled to the MOS transistor 206 at an interchangeable source/drain region 212a. The logic region 204 includes a MOS transistor 209 with its two interchangeable regions 210. Then, a first ILD layer 214 is deposited over the substrate 200. Because of the capacitor 208 structure, the difference in height on the ILD layer 214 between the memory region 202 and the logic region 204 is as large as about 9000 Å.

Next, referring to FIG. 2B, a CMP planarization is performed on the ILD layer 214 to form an ILD layer 214a. Its difference in height is reduced to about 4000–5000 Å. In the logic region 204, a contact window/plug 216 and a first metal layer 215 are formed and electrically coupled together and to one of the interchangeable source/drain regions 210. The first metal layer 215 and the contact window/plug 216 include, for example, titanium, titanium nitride or tungsten and can be made of either the same material or different materials. The first metal layer 215 is a dummy pattern without being involved in the circuit design and is only used to extend the electrical connection as is described below.

Figure 2C:
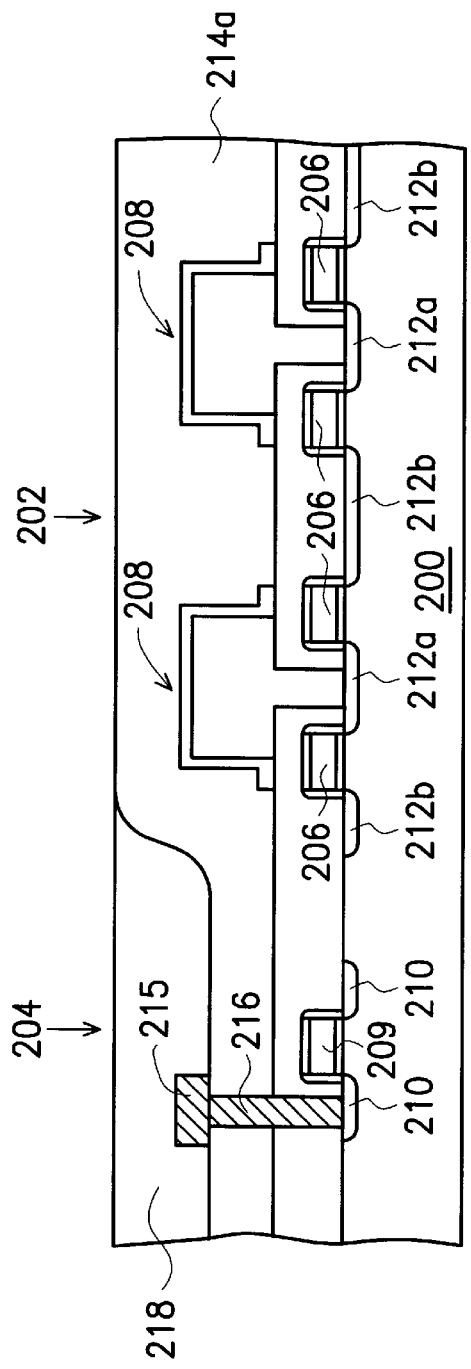

Next, in FIG. 2C, a second ILD layer 218 is deposited over the logic region 204. Then a CMP planarization is performed to have a zero difference in height, so that the first ILD layer 214a and the second ILD layer 218 have the same altitude.

Figure 2D:
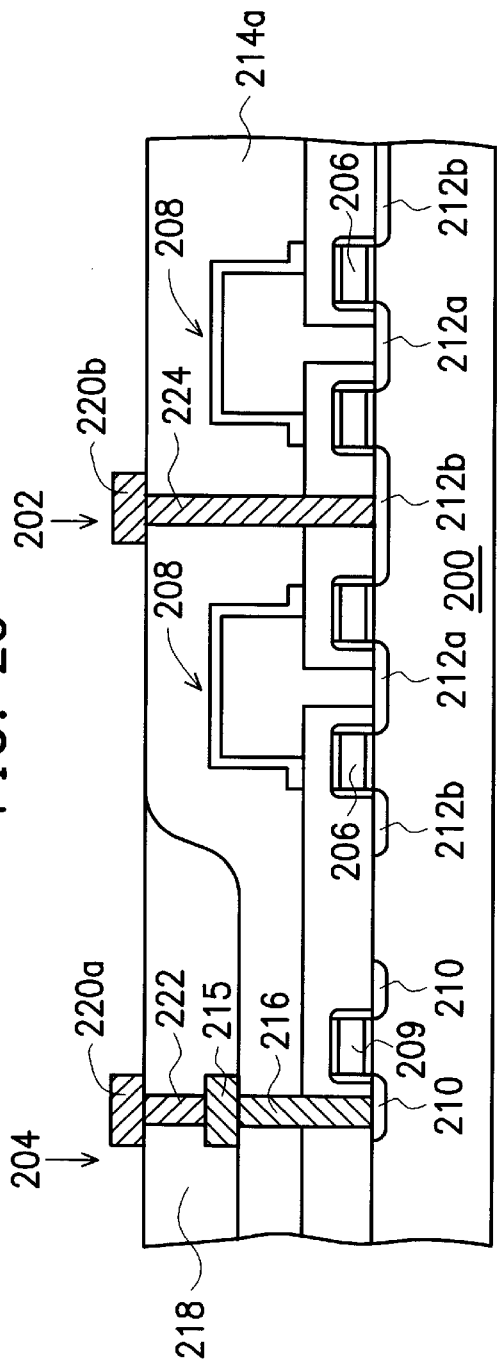

In FIG. 2D, then, a metallization is performed as follows. A second metal layer 220a, with its via hole/plug 222, is formed over the substrate 200 at the logic region 204. A second metal layer 220b, with its contact window/plug 224, is formed over the substrate 200 at the memory region 202. The second metal layer 220b is therefore electrically coupled to the interchangeable source/drain region 212b through the contact window/plug 224. The second metal layer 220a is indirectly electrically coupled to the interchangeable source/drain region 210 through the via hole/plug 222, the first metal layer 215 and the contact window/plug 216. The second metal layers 220a and 220b are involved in the circuit design and have the same relative height on the substrate 200. This is helpful in the subsequent fabrication processes.

In conclusion, the invention improves the planarization quality on the embedded DRAM by using a dummy circuit layer to compensate for the difference in height. The dummy circuit layer is composed of the second ILD layer 218 and the via hole/plug 222. In the invention, even though an additional process is required, it is quite helpful in the subsequent fabrication processes that a high quality planarization is achieved. Through this, the quality of the embedded DRAM is ensured.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A planarization method for an embedded dynamic random access memory (DRAM), which has a logic region comprising a first metal-oxide semiconductor (MOS) transistor, and a memory region comprising a second MOS transistor and a capacitor, the planarization method comprising:

forming a first inter-layer dielectric (ILD) layer over the substrate, wherein a difference in height exists between the logic region and the memory region, and the logic region has a lower height;

forming a first metal layer over the logic region, wherein the first metal layer is electrically coupled to one of two interchangeable source/drain regions of the first MOS transistor through a first contact opening, patterned on the first ILD layer;

forming a second ILD layer over the logic region to compensate for the difference in height;

performing planarization on the substrate, wherein after planarization, the logic region and the memory region have no difference in height; and forming a second metal layer over the substrate, wherein the second metal layer above the memory region is electrically coupled to one of two interchangeable source/drain regions of the second MOS transistor through a second contact opening patterned on the first ILD layer, and the second metal layer above the logic region is electrically coupled to the first metal layer through a via opening patterned on the second ILD layer.

2. The planarization method of claim 1, wherein the first metal layer comprises titanium.

3. The planarization method of claim 1, wherein the step of forming the first metal layer further includes forming a titanium nitride layer.

4. The planarization method of claim 1, wherein the first metal layer comprises titanium tungsten.

5. The planarization method of claim 1, wherein the step of performing planarization further comprises chemical mechanical polishing (CMP).

6. The planarization method of claim 1, wherein the step of forming the first ILD layer further comprises a planarization process.

7. The planarization method of claim 1, wherein the first metal layer completes an electrical connection between the contacted interchangeable source/drain region of the first MOS transistor and the second metal layer.

8. The planarization method of claim 1, wherein the first metal layer comprises a plug portion filled in the first contact opening.

9. The planarization method of claim 1, wherein the second metal layer in the memory region comprises a plug portion filled in the second opening.

10. The planarization method of claim 1, wherein the second metal layer in logic region comprises a plug portion filled in the via opening.

* * * * *